United States Patent
Kyomasu et al.

(10) Patent No.: US 6,719,183 B2
(45) Date of Patent: Apr. 13, 2004

(54) TRANSDUCER AND A BONDING APPARATUS USING THE SAME

(75) Inventors: Ryuichi Kyomasu, Kodaira (JP); Yoshihiko Seino, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 18 days.

(21) Appl. No.: 10/185,583

(22) Filed: Jun. 28, 2002

(65) Prior Publication Data

US 2003/0000994 A1 Jan. 2, 2003

(30) Foreign Application Priority Data

Jun. 28, 2001 (JP) ........................ 2001-196251

(51) Int. Cl.[7] .......................... B23K 5/20; B23K 37/00; B32B 31/16; B32B 31/00
(52) U.S. Cl. ................. 228/1.1; 228/110.1; 228/4.5; 228/180.5; 156/73.1; 156/580.1; 156/580.2; 310/323.18; 310/325
(58) Field of Search ............... 228/1.1, 110.1, 228/119.5, 4.5, 180.5; 156/73.1, 580.1, 580.2; 310/323.18, 325, 334

(56) References Cited

U.S. PATENT DOCUMENTS

| 3,772,538 | A | * | 11/1973 | Supitilov | .................... 310/325 |
|---|---|---|---|---|---|
| 4,074,152 | A | * | 2/1978 | Asai et al. | ................... 310/334 |
| 5,469,011 | A | * | 11/1995 | Safabakhsh | ................. 310/325 |
| 5,486,733 | A | * | 1/1996 | Yamazaki et al. | ..... 310/323.18 |
| 6,073,827 | A | * | 6/2000 | Razon et al. | ................. 228/4.5 |
| 6,173,878 | B1 | * | 1/2001 | Stroh | .......................... 228/1.1 |
| 6,189,761 | B1 | * | 2/2001 | Kyomasu | .................... 228/1.1 |
| 6,247,628 | B1 | * | 6/2001 | Sato et al. | ................... 228/1.1 |

FOREIGN PATENT DOCUMENTS

| JP | H5-347334 | | 12/1993 |
|---|---|---|---|
| JP | H6-196532 | | 7/1994 |
| JP | 06-269077 A | * | 9/1994 |
| JP | H10-303240 | | 11/1998 |
| JP | 2001-024025 | | 1/2001 |

* cited by examiner

Primary Examiner—L. Edmondson (74) Attorney, Agent, or Firm—Koda & Androlia (57) ABSTRACT

A transducer vibrated by a vibrator and used in a bonding apparatus, the transducer including holding portions provided so as to protrude at at least two locations that correspond to the nodes of vibration of a transducer main body, and connecting portions each connecting the tip ends of two protruding holding portions to each other. The transducer main body, holding portions and connecting portions are integrally formed from a single material member.

13 Claims, 6 Drawing Sheets

TRANSDUCER AND A BONDING APPARATUS USING THE SAME

BACKGROUND OF THE INVENTION

1. Field of the Invention

The present invention relates to a transducer which is used in a bonding apparatus and to a bonding apparatus which is structured to include the transducer.

2. Prior Art

In a bonding apparatus including wire bonding apparatuses, a transducer such as an ultrasonic horn and the like is used. Bonding is accomplished by applying a load and ultrasonic vibrations to the bonding section of the horn by causing the transducer to vibrate in the lengthwise direction (axial direction) of the transducer by a vibrator and at the same time by lowering a bonding tool mounted at the tip end of the transducer toward the object of process (bonding) and applying a load thereto.

Figure 6:
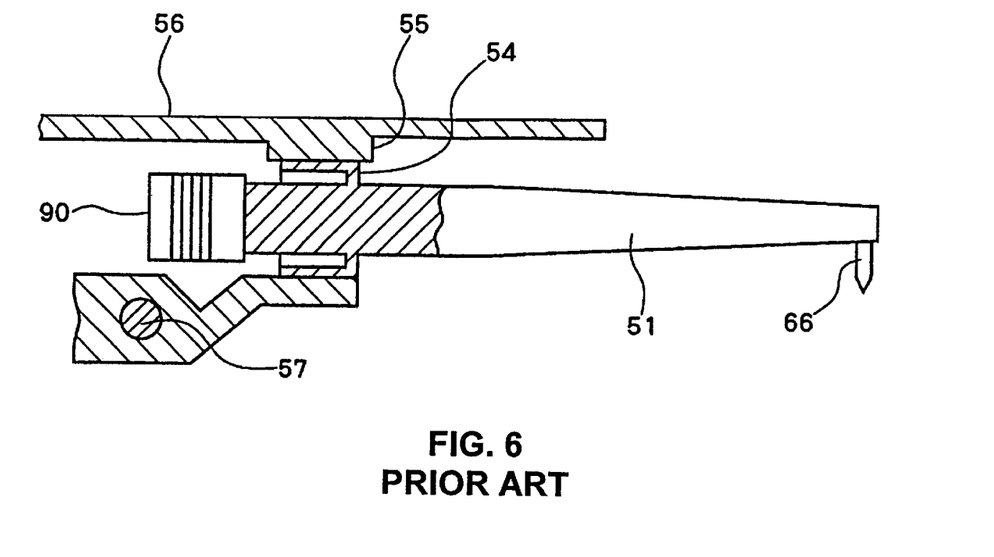
FIG. 6 is a side view of an attachment structure of a conventional transducer (ultrasonic horn)

A conventional supporting structure for such a transducer used in a wire bonding apparatus (not shown) is shown in FIG. 6.

In this transducer, a capillary 66 used as a bonding tool. The capillary 66 is attached to the tip end of an ultrasonic horn 51 that is used as a transducer, and a wire (not shown) passes through the capillary 66. An ultrasonic vibrator 90 is fastened to the base end of the ultrasonic horn 51. A flange 54 which has a cylindrical shape and is connected to the ultrasonic horn 51 at the front end of said flange 54 is disposed on the ultrasonic horn 51. The flange 54 is provided so that it is at a node (i.e., a point where the strain reaches the maximum) position of the ultrasonic vibration, which is applied as a compressional wave (longitudinal wave) in the axial direction, i.e., the direction of length of the horn 51. The flange 54 is connected to a cylindrical horn support 55. The horn support 55 is fastened to a transducer holder 56, and this transducer holder 56 is fastened to a supporting shaft 57. The supporting shaft 57 is supported on a bonding head (not shown) of the bonding apparatus either directly or via a lifter arm, so that the supporting shaft 57 is free to rotate.

Wire bonding apparatuses of this type are disclosed in, for example, Japanese Patent Application Laid-Open (Kokai) Nos. 5-347334, 6-196532 and 10-303240.

In the above prior art, the flange 54 is disposed at a node position of the ultrasonic vibration in the ultrasonic horn 51. Accordingly, the energy loss (so-called leakage) via this flange 54 is small; and thus, a defective crushed shape of the ball, stripping of the ball or damage to the substrate, etc., caused by the continued application of unnecessary ultrasonic energy following the completion of bonding can be prevented.

However, as the operation of the bonding apparatus is performed at higher speeds, oscillation during the raising and lowering movement of the transducer becomes a problem. In this respect, since the ultrasonic horn 51 in the above prior art is supported at only one place, it is difficult to effectively suppress the oscillation of the transducer caused by the operation of the bonding head. When such oscillation occurs, an excessive force is applied to the ball during bonding, and defects in the crushed shape of the ball occur. This problem is especially conspicuous in the diameters of press-bonded balls that have been reduced as a result of the increasingly finer pitch of recent semiconductor devices.

Figure 7:
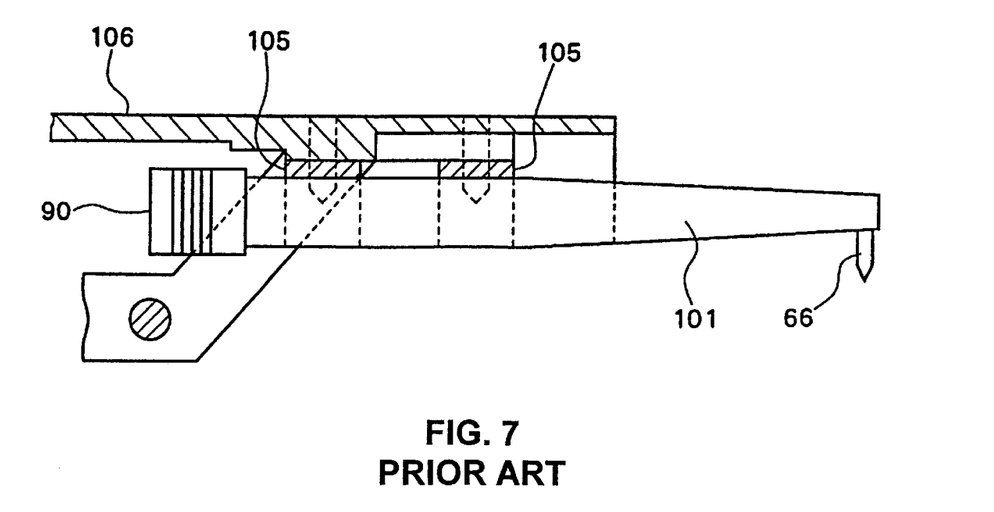
FIG. 7 is a side view of an attachment structure of another conventional transducer (ultrasonic horn)

In order to deal with oscillation of the transducer during the raising and lowering movement of the transducer, the applicant of the present invention has proposed in Japanese Patent Application Laid-Open (Kokai) No. 2001-24025 a transducer structure as shown in FIG. 7.

In this structure, an ultrasonic horn 101 used as a transducer is attached to a transducer holder 106 via two horn supporting members 105 that are separate elements from the ultrasonic horn 101. The attachment positions of the horn supporting members 105 in the axial direction of the ultrasonic horn 101 are adjustable. In this structure, since there are two supporting points, oscillation during the raising and lowering movement of the ultrasonic horn 101 can be effectively prevented. Furthermore, a loss of the ultrasonic vibration (compressional wave) in the axial direction of the horn can also be prevented by causing the attachment positions of the horn supporting members 105 with respect to the ultrasonic horn 101 to coincide with node positions of the vibration of the ultrasonic horn 101.

Incidentally, as the regions where the horn supporting members (horn supporting members 105 in the structure of FIG. 7) are connected to the ultrasonic horn become larger (thicker) in the direction of length of the ultrasonic horn, the portions of these regions that are away from the nodes of the vibration increase. As a result, there is a corresponding increase in the energy loss. More specifically, in order to reduce the energy loss that occurs via the horn supporting members, it is desirable to form the horn supporting members as thin as possible in the axial direction of the ultrasonic horn. However, if the horn supporting members are thin, then there is a corresponding drop in the strength of the horn supporting members.

Furthermore, in the structure in which the ultrasonic horn 51 is supported at a single point as shown in FIG. 6, the cutting work for forming the cylindrical flange 54 into a cylindrical shape that is open at one end is difficult, and it is also difficult to reduce the size of the ultrasonic horn 51. Moreover, in the structure that uses two horn supporting members 105 that are independent elements from the ultrasonic horn 101 as shown in FIG. 7, the total number of parts increases, and assembly becomes bothersome.

SUMMARY OF THE INVENTION

Accordingly, the object of the present invention is to provide a transducer having a structure that provides the supporting members of the transducer with strength and that makes it possible to form such supporting members as thin as possible in the axial direction of the transducer.

The above object is accomplished by a unique structure for a transducer which is caused to vibrate by an operation of a vibrator, and the transducer of the present invention comprises: holding portions which are provided in at least two areas that include nodes (or node positions) of vibration in a transducer main body, and connecting portions that connect the holding portions to each other at areas that differ from areas where the holding portions protrude from the transducer main body; and further the transducer main body, the holding portions and the connecting portions are integrally formed from a single material member.

In the structure of the above-described transducer of the present invention, the holding portions are disposed in at least two areas that include nodes of vibration in the transducer main body. Accordingly, oscillation of the transducer is prevented without causing a vibrational energy loss in the axial direction of the transducer. Furthermore, in the transducer of the present invention, the connecting portions that connect the holding portions to each other are provided at areas that differ from areas where the holding portions protrude from the transducer main body. Accordingly, the external force applied to one of the holding portions is dispersed in each of the respective holding portions connected by the connecting portions, and deformation of the holding portions is prevented. Accordingly, the respective holding portions can be formed extremely thin in the axial direction of the transducer main body.

Furthermore, since the transducer main body, holding portions and connecting portions are formed integrally from the same member, a sufficient strength is secured at the connection areas between the holding portions and the transducer main body, and the holding portions can be made even thinner.

In the transducer of the present invention, the holding portions have a plate-form, and they are disposed in a direction of operation of the transducer main body.

Since the plate-form holding portions are disposed in the direction of operation of the transducer main body, the cross-section of the connection areas between the transducer main body and the holding portions have a shape in which the direction of the length of such areas is equal to the direction of operation of the transducer. Consequently, even in the case of bonding that accompanies large load, a large cross-section is secured at the connection areas between the transducer main body and the holding portions, and the ability to withstand shearing increases.

Furthermore, in the transducer of the present invention, of the holding portions, one holding portion is disposed at an n-th node (n is a natural number) position from the base end of the transducer main body, and another holding portion is disposed at an n+m-th node (m is an odd number) position; and the connecting portions are provided with fastening means for fastening the connecting portions of the transducer to a transducer holder.

Generally, the vibrational characteristics of a transducer, and especially the characteristic vibration frequency and the vibration period that is the reciprocal of this frequency, are not always the same in individual transducers. In other words, it is considered that a slight variation occurs depending on the working precision, etc. In this regard, the transducer of the present invention is designed so that one holding portion is disposed at the n-th node (n is a natural number) position from the base end of the transducer main body, and another holding portion is disposed at the n+m-th node (m is an odd number) position from the base end of the transducer main body. Accordingly, even in cases where the actual positions of the nodes of vibration are shifted from the designed positions as a result of variation in the vibrational characteristics, the forces acting on the respective holding portions have opposite phases, and thus such forces are cancelled each other in the connecting portions. Accordingly, with the transducer of the present invention, it is possible to avoid such a situation that the energy that leaks out of the transducer main body via the respective holding portions is transmitted as a vibration to the transducer holder that is fastened by the fastening means or to the bonding head driving mechanism that is fastened to this transducer holder.

Furthermore, in the transducer of the present invention, the fastening means are disposed at at least two different locations in a direction of length of the connecting portions of the transducer.

In this structure, since the fastening means are disposed at at least two different points in the direction of length of the connecting portions, oscillation in the direction of operation of the transducer is effectively suppressed.

Furthermore, in the transducer of the present invention, the fastening means are respectively disposed in positions that are equal to each other in terms of length of vibration transmission paths that are formed by the holding portions and the connecting portions.

In this structure, the respective fastening means are disposed in positions that are equal to each other in terms of the length of the vibration transmission paths that are formed by the holding portions and connecting portions. Accordingly, the forces that act on the respective holding portions from the transducer main body have opposite phases at the positions of the fastening means.

Furthermore, in the transducer of the present invention, the holding portions and the connecting portions are disposed on both sides of the axial center of the transducer main body so that the holding portions and the connecting portions are symmetric with respect to the axial center of the transducer.

In this structure, the holding portions and connecting portions are disposed on both sides of the axial center of the transducer main body, and these elements are positionally symmetrical with respect to the axial center. Accordingly, as to two holding portions that are disposed symmetrically on either side of a given node of vibration, the directions of the forces caused by leakage of the vibration of the vibrator are mutually opposite directions. Thus, by way of fastening both of these holding portions to a transducer holder, the leaking energies are cancelled out each other, and the transmission of vibration to the transducer holder or to the bonding head driving mechanism to which this transducer holder is fastened is prevented.

Furthermore, in the transducer of the present invention, the holding portions and the connecting portions are provided in directions that cross (at right angles) the direction of operation of the transducer.

Accordingly, by utilizing the connecting portions so as to fasten the transducer main body to a transducer holder or to the bonding head driving mechanism, it is possible to increase the dimension of the transducer main body in the direction of operation and especially to increase the clearance on the underside of the transducer main body when the direction of operation is set to be oriented downward.

Furthermore, the transducer of the present invention includes thin portions disposed between the holding portions and the connecting portions so as to absorb vibrations.

With this structure, the transmission of vibrational energy from the holding portions to the connecting portions is buffered by the elastic deformation of the thin portions even in cases where vibrational energy leaks from the transducer main body.

The transducer of the present invention is obtained by forming through-holes in a matrix material for the transducer main body and by forming the holding portions and the connecting portions around the through-holes.

Since the transducer is manufactured by forming through-holes in a matrix material that constitutes the transducer main body and then by forming the holding portions and connecting portions around through-holes, working is simple even in cases where any working method such as cutting, casting, etc. is employed.

When the above-described transducer is used in a bonding apparatus, the advantages and effect described above with reference to the transducer are obtained.

DETAILED DESCRIPTION OF THE INVENTION

Embodiments of the present invention will be described below with reference to the accompanying drawings.

Figure 1:
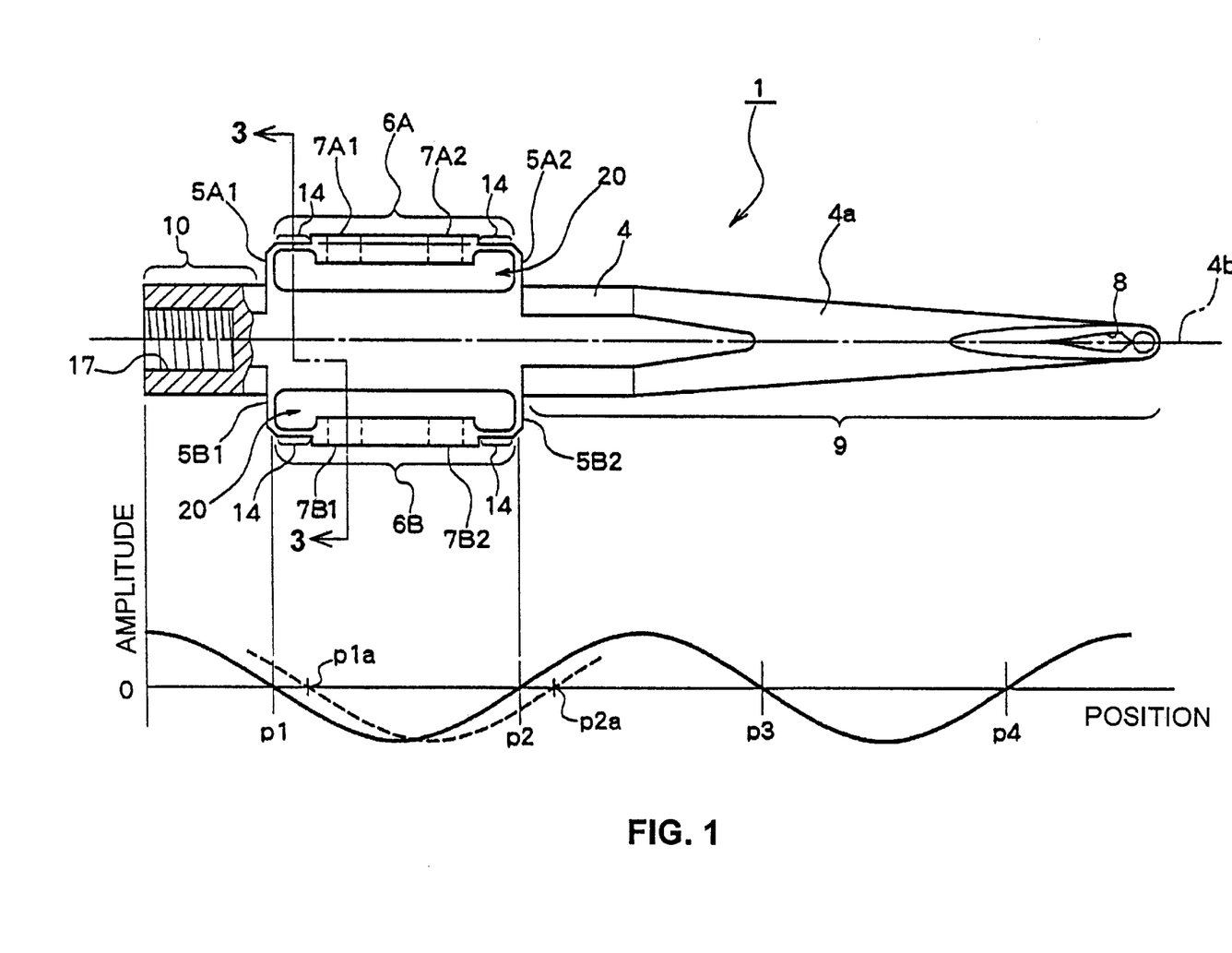
FIG. 1 is a top view of a transducer used as a bonding horn according to the present invention, a graph indicating the positions of the nodes of vibration being shown with reference to the transducer.
Figure 2:
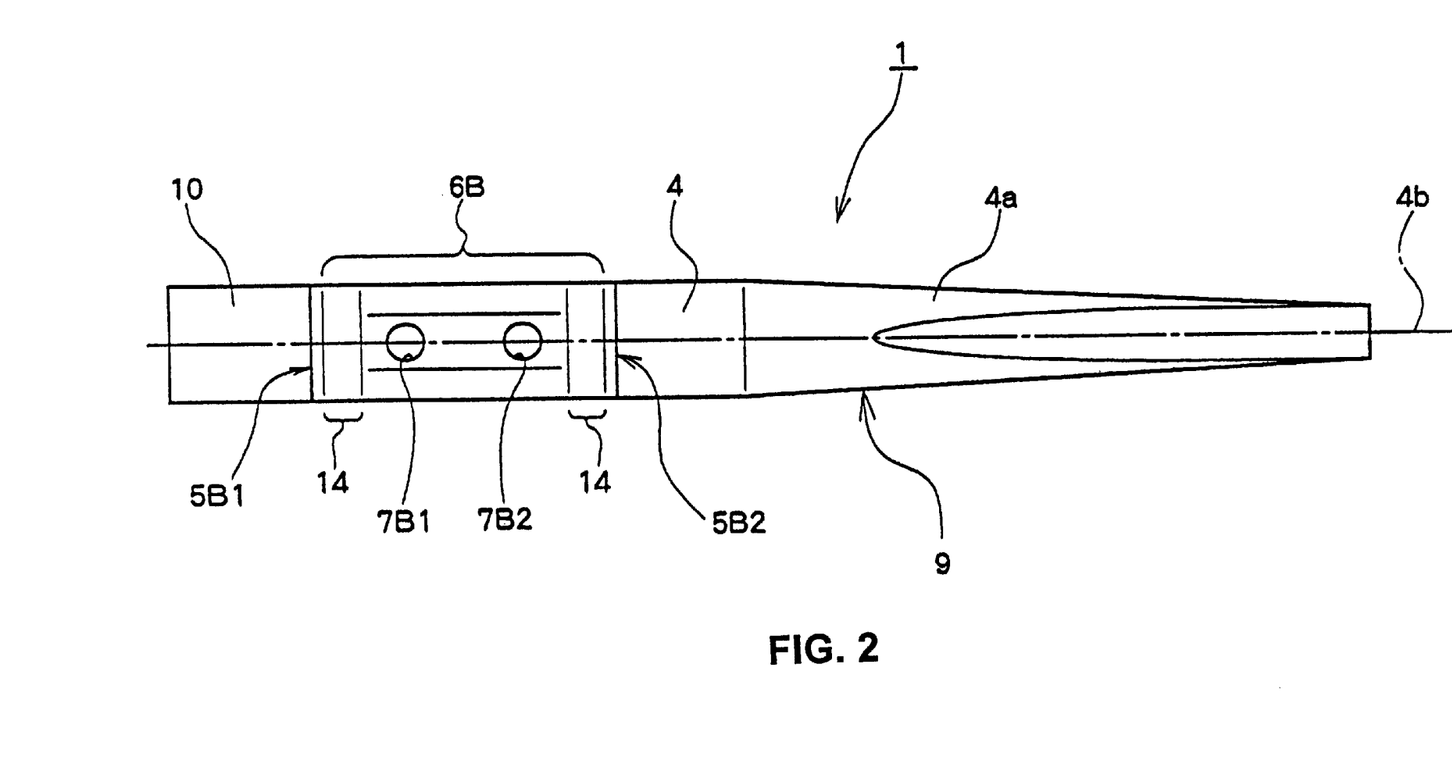
FIG. 2 is a side view thereof.

The ultrasonic horn 1 used as a transducer of the present invention is, as seen from FIG. 1, comprised of: a substantially cylindrical horn main body (or a transducer main body) 4, holding portions 5A1, 5A2, 5B1 and 5B2 (collectively referred to as "holding portions 5"), and connecting portions 6A and 6B (collectively referred to as "connecting portions 6"), which are integrally formed from the same or single material member.

The horn main body 4 has a cone portion 4a formed on the front-side (or at the tip-end). The holding portions 5 (5A1, 5A2, 5B1 and 5B2) are disposed in two areas each on the left and right sides (for a total of four areas) on the horn main body 4. In other words, the holding portions 5A1 and 5A2 are on one side of the horn main body 4, and the holding portions 5B1 and 5B2 are on another side of the horn main body 4. The connecting portions 6 (6A and 6B) connect the side ends of two (front and rear) holding portions 5 to each other. In other words, the connecting portion 6A connects the end portions of the holding portions 5A1 and 5A2 that protrude sideways from the horn main body 4; and the connecting portion 6B connects the end portions of the holding portions 5B1 and 5B2 that protrude sideways from the horn main body 4.

Figure 5:
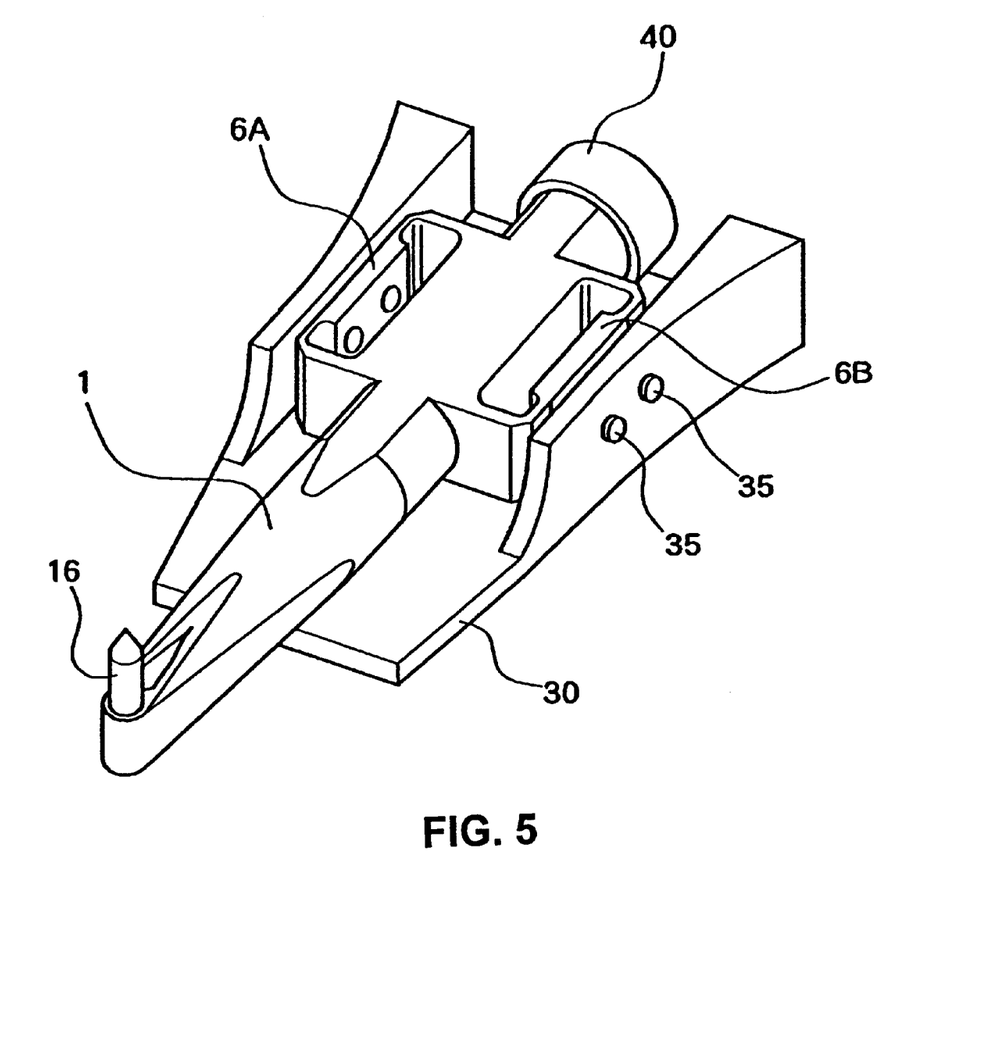
FIG. 5 is a schematic perspective view of the under side of the transducer mounted to a transducer holder.

The ultrasonic horn 1 further has a screw hole 17 on the rear-side (or at the base-end). To this screw hole 17, an ultrasonic vibrator 40 (see FIG. 5) that generates an ultrasonic vibration is fastened.

The shape of the cone portion 4a is universally known conical shape.

Figure 4:
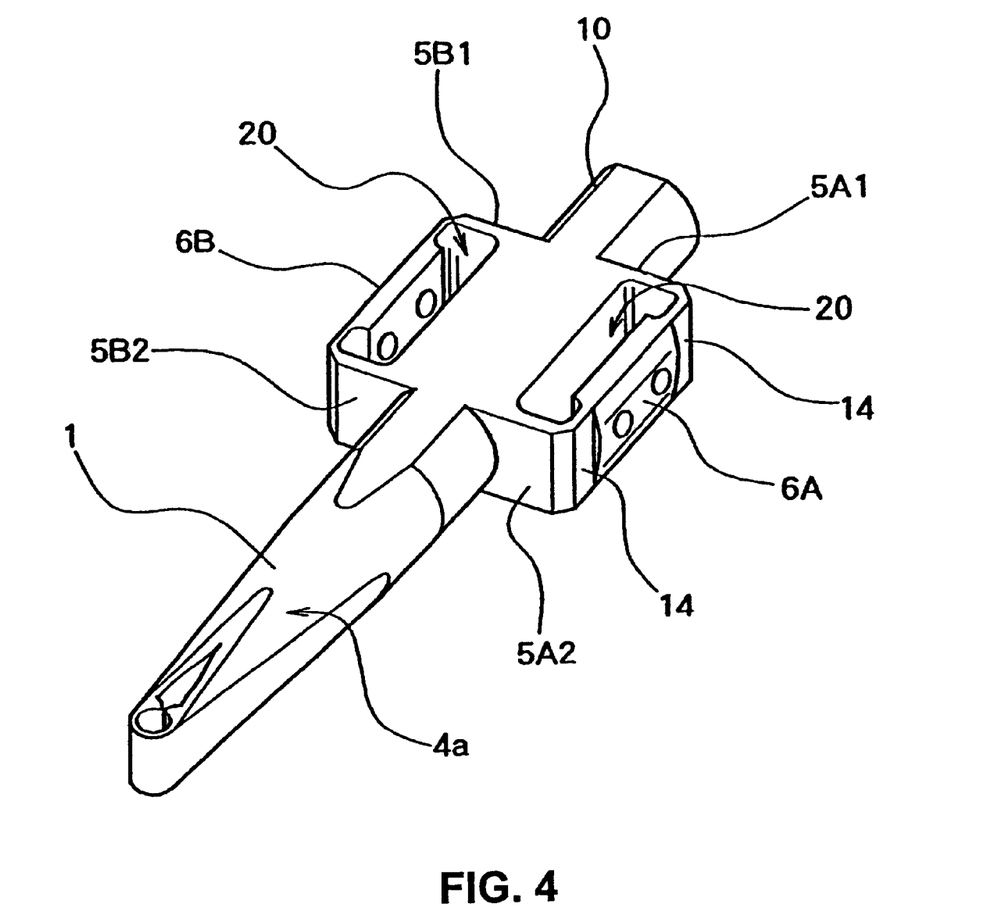
FIG. 4 is a schematic perspective view of the transducer.

The holding portions 5 are all flat-plate-form elements as seen from FIGS. 1 and 4 when viewed from above. Of the four holding portions 5, the holding portions 5A1 and 5B1 on the rear side of the horn main body 4 are disposed at a position of the first node p1 from the base end of the horn main body 4, and the holding portions 5A2 and 5B2 on the front side of the horn main body 4 are disposed at a position of the second node p2 from the base end of the horn main body 4. More specifically, the holding portions 5 are designed so that their intermediate points in the direction of thickness (in the left and right directions in FIG. 1) accurately coincide respectively with the nodes p1 and p2 of vibration in the design of the ultrasonic horn 1. However, since there is a certain variation in the actual positions of the nodes of vibration of the ultrasonic horn 1 depending upon the manufacturing precision of the ultrasonic horn 1, the actual positions of the nodes of vibration may differ from the designed positions in some cases. The thickness of the respective holding portions 5 is approximately 0.5 mm.

Screw holes 7A1, 7A2, 7B1 and 7B2 (collectively referred to as "screw holes 7") that constitute fastening means used for fastening the connecting portions 6A and 6B of the ultrasonic horn 1 to a transducer holder 30 (see FIGS. 3 and 5) are formed in the connecting portions 6A and 6B.

The screw holes 7 are respectively formed at two points located at different positions in the direction of length (in the left and right directions in FIG. 1) of the connecting portions 6A and 6B.

Respective flat-plate-form thin portions 14 are formed in the front and rear portions of the connecting portions 6A and 6B. The thickness of these thin portions 14 is approximately 0.5 mm.

The respective holding portions 5A1, 5A2, 5B1 and 5B2 have equal lengths (i.e., equal lengths in the top-bottom direction in FIG. 1). The lengths of the connecting portions 6A and 6B are likewise equal to each other (i.e. equal in the left-right direction in FIG. 1).

Moreover, the screw holes 7A1 and 7A2 are disposed so that these screw holes are symmetrical with respect to each other. In other words, the screw holes 7A1 and 7A2 are disposed at positions that are located at equal distances from the front and rear ends of the connecting portions 6. The same applies to the screw holes 7B1 and 7B2. Accordingly, the screw holes 7A1 and 7A2, and the screw holes 7B1 and 7B2, are disposed in positions that are equal to each other in terms of a path-length of the vibration transmission paths that are formed (or represented) by the holding portions 5 and connecting portions 6.

Figure 3:
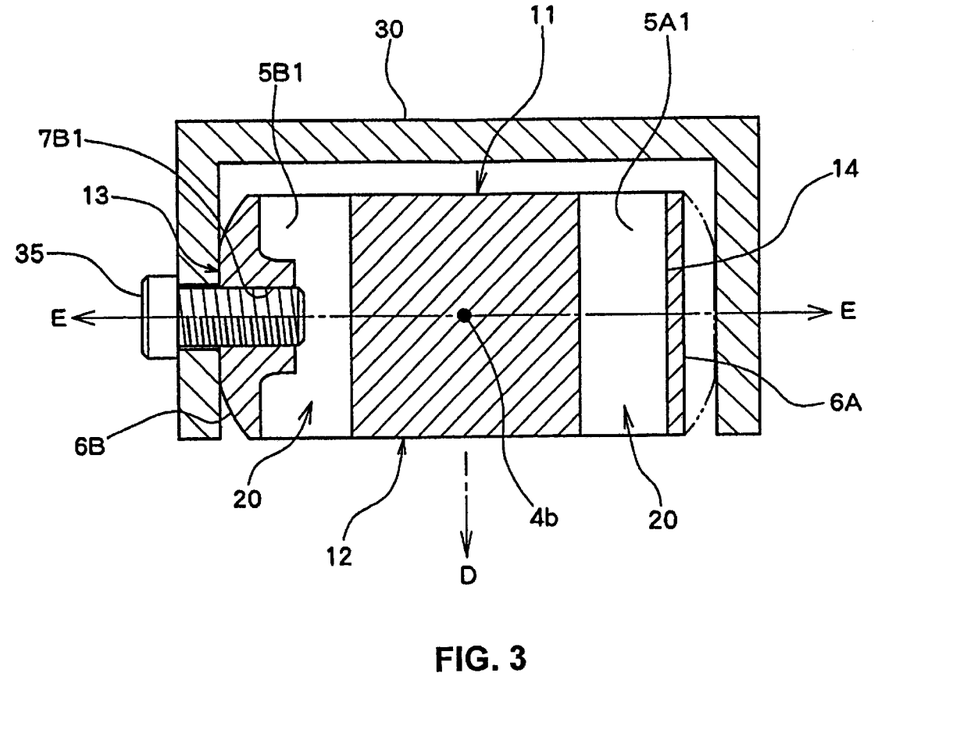
FIG. 3 is an enlarged sectional view of the transducer mounted to a transducer holder, the transducer being taken along the line 3—3 in FIG. 1.

As shown in FIGS. 1 and 3, the holding portions 5A1 and 5A2 and connecting portion 6A, and the holding portions 5B1 and 5B2 and connecting portion 6B, are disposed on both sides of the axial center 4b of the horn main body 4 so that these elements are symmetrical with respect to the axial center 4b.

Furthermore, the holding portions 5A1 and 5A2 and connecting portion 6A, and the holding portions 5B1 and 5B2 and connecting portion 6B, are formed so as to project in the horizontal direction (or in a direction of E—E in FIG. 3 or in a top-bottom direction in FIG. 1) that crosses (at right angles) the vertical downward direction (the direction D in FIG. 3) that is the direction of operation of the ultrasonic horn 1. In other words, the holding portions 5 are formed so as to project sideways from the ultrasonic horn (transducer main body) 1, and the connecting portions 6 connect the tip end areas of the holding portions 5, such tip end areas being different (or opposite) from the areas where the holding portions 5 project from the ultrasonic horn (transducer main body) 1.

The ultrasonic horn 1 is manufactured in the following manner:

First, a mounting hole 8 for mounting a capillary 16 (see FIG. 5) is bored by means of a broaching mill in the front-side portion of a round bar material that constitutes the matrix material. In addition, the screw hole 17 is bored in the base end (or the rear-side portion) of the round bar material.

Next, the front side and rear side of the round bar material are cut in toward the axial center 4b by means of a lathe, thus forming a front-side portion 9 and a rear-side portion 10.

Next, a top plane 11, bottom plane 12 and side planes 13 (see FIG. 3) are respectively formed by means of a milling machine, and also the outside surfaces of the thin portions 14 are formed. Furthermore, screw holes 7 (7A1, 7A2, 7B1 and 7B2) are formed by means of an end mill and tap.

Then, through-holes 20 are formed in the vertical direction on both sides of the axial center 4b by an end mill. The shape of the through-holes 20 in a top view is invariable (consistent) with respect to the vertical direction. As a result of the boring of the through-holes 20, the horn main body 4, holding portions 5 and connecting portions 6 are integrally formed around the through-holes 20 from the same or a single matrix material member; and as a result, empty spaces defined by the through holes 20 surrounded by the horn main body 4, holding portions 5 and connecting portions 6 are provided on both sides of the horn main body 4.

The ultrasonic horn 1 thus manufactured is fastened to a horn or transducer holder 30 (see FIGS. 3 and 5), which is C-shaped in cross-section and open at the bottom, by way of screwing bolts 35 into the respective screw holes 7A1 through 7B2. As a result, the ultrasonic horn 1 is fastened to the transducer holder 30 at four points on a horizontal plane indicated by the line E—E in FIG. 3. At an appropriate area on the end surface of the base portion of the transducer holder 30, the transducer holder 30 is fastened to the bonding head driving mechanism of a wire bonder main body (not shown).

The bonding head driving mechanism moves the ultrasonic horn 1 to any desired position on the horizontal plane and also applies a desired downward-oriented load to the ultrasonic horn 1. Meanwhile, a known ultrasonic vibrator 40 formed by stacking magnetostriction elements in the axial direction is fastened in place in the screw hole 17 that is formed in the base end of the horn main body 4. A capillary 16 is set in the mounting hole 8.

In the above structure, the ultrasonic vibration generated by the ultrasonic vibrator 40 is transmitted from the base end toward the tip end of the ultrasonic horn 1 in the direction of length, i.e., along the axial center 4b, as a compressional wave (longitudinal wave).

In the above-described embodiment, the holding portions 5 are provided in two areas that include the nodes p1 and p2 of vibration in the horn main body 4. Accordingly, since these nodes are at points where no vibration occurs, there is no loss of the vibrational energy of the compressional wave (longitudinal wave) along the axial center 4, and oscillation of the ultrasonic horn 1 is prevented. In addition, since the connecting portions 6 are provided so as to connect the tip ends of the holding portions 5 to each other in locations that differ from the locations where the respective holding portions 5 project from the horn main body 4, an external force that is applied to one of the holding portions 5 (e.g., the holding portion 5A1) is dispersed in each of the respective holding portions 5 (e.g., the holding portions 5A1 and 5A2) that are connected by the connecting portions 6. As a result, deformation of the holding portions 5 is suppressed, and the respective holding portions 5 can be formed extremely thin in the direction parallel to the axial center 4b.

Furthermore, since the horn main body 4, holding portions 5 and connecting portions 6 are integrally formed by being cut from a round bar material that is a single material member, the connection between the holding portions 5 and horn main body 4 is as strong as a metal connection. Accordingly, the holding portions 5 can be made much thinner.

In the shown embodiment, the flat-plate-form holding portions 5 and flat-plate-form thin portions 14 are both formed to extend in the vertical direction (see FIGS. 3 and 4) in the direction of operation (that is in a vertical direction) of the ultrasonic horn 1. Accordingly, the cross-sections of the connection areas between the horn main body 4 and the holding portions 5, and the cross-sections of the connection areas between the holding portions 5 and the thin portions 14, are both long in the vertical direction. Consequently, even in the case of bonding that accompanies a large load, it is unlikely that a plastic deformation, which is caused by the upward and downward movement of the ultrasonic horn 1, occurs in the holding portions 5 or in the thin portions 14. Furthermore, since the cross-sections of the respective connection areas are formed large, the ability to withstand shearing is high.

Incidentally, the vibrational characteristics of the ultrasonic horn 1, and especially the characteristic vibrational frequency and the vibration period that is the reciprocal of this frequency, are not always the same for individual ultrasonic horns. It appears that there is some slight variation depending on the working precision, etc. of the ultrasonic horns 1. In this regard, in the present invention, the holding portions 5A1 and 5B1 are disposed at point p1, which is the first node position from the base end of the horn main body 4, and the holding portions 5A2 and 5B2 are disposed at point p2, which is the second node position. Accordingly, even in a case where the actual nodes of vibration of the ultrasonic horn 1 are located at points p1a and p2a (see FIG. 1), which are shifted from the designed positions, the forces acting on the base end and tip end of the respective holding portions 5 have mutually opposite phases. For instance, the amplitude applied to the holding portions 5A1 and 5B1 which are on the base end side of the ultrasonic horn 1 is positive, and the amplitude applied to the holding portions 5A2 and 5B2 which are on the tip end side is negative. Furthermore, the base end side holding portions 5A1 and the tip end side holding portions 5A2 are connected to each other by the connecting portion 6A, and the base end side holding portions 5B1 and the tip end side holding portions 5B2 are connected to each other by the connecting portion 6B. Accordingly, the forces acting on the base end and tip end of the respective holding portions 5 are cancelled out each other in the connecting portions 6. Thus, a situation, in which the energy that leaks out from the horn main body 4 via the holding portions 5 is transmitted as a vibration to the transducer holder 30 fastened by bolts 35 and connecting portions 6 or to the bonding head driving mechanism, can be avoided.

Furthermore, in addition to the structure in which the positions of two holding portions are set at adjacent nodes as described above, a mutual cancellation of vibrational energies can be obtained also by a different structure in which one holding portion 5 is disposed at an n-th node (n is a natural number) position from the base end of the horn main body 4 and the other holding portion 5 is disposed at an n+m-th node (m is an odd number) position from the base end of the horn main body 4. For instance, two holding portions 5A1 and 5B1 can be disposed at the first node p1 and other two holding portions 5A2 and 5B2 at the fourth node p4, or they can be at the third node p3 and fourth node p4, respectively.

Furthermore, the holding portions 5 that are at a first position from the base end of the horn main body 4 can be disposed at some other desired node position instead of the first node position. However, in order to effectively reduce the leakage of vibrational energy to the holding portions 5 that accompanies the variation in the above-described vibrational characteristics, it is most desirable that the first holding portions 5 from the base end of the horn main body 4 be disposed at the first node p1, which is the closest node position to the ultrasonic vibrator 40.

In the transducer described above, two screw holes 7 that are the fastening means are disposed at different positions in the direction of length of the connecting portions 6. Accordingly, oscillation in the direction of operation of the ultrasonic horn 1 (that corresponds to the vertical direction D of FIG. 3) is effectively prevented. Moreover, the number of points where fastening is made via screw holes 7 can be three or more (instead of two points), and the same effect can be expected in such structures. Furthermore, some other fastening means besides screws may also be used. In the structure described above, the screw holes 7 and bolts 35 are employed, and the bolts 35 are screwed in toward the axial center 4b of the ultrasonic horn 1. With this structure, a high dimensional precision with respect to the vibration is maintained compared to cases where the bolts are screwed in some other direction.

Furthermore, in the shown embodiment, the screw holes 7 are disposed at positions that are equal to each other in terms of the length of the vibration transmission paths that are formed by the holding portions 5 and connecting portions 6 (in concrete terms, such a "length" is the distance from the connection areas between the holding portions 5 and the horn main body 4 to the axial centers of the screw holes 7 in the paths that run along the holding portions 5 and connecting portions 6). Accordingly, the forces that act on the respective holding portions 5 from the horn main body 4 is caused to have mutually opposite phases at the positions of the screw holes 7.

In the shown embodiment, further, the holding portions 5 and connecting portions 6 are disposed on both sides of the axial center 4b of the horn main body 4 so that these elements are symmetrical with respect to this axial center 4b (FIGS. 1 and 3). Accordingly, for two holding portions 5 that are symmetrically disposed on both sides of a certain node (for instance, for the holding portions 5A1 and 5B1), the forces caused by the leakage of vibration are in the same phase and mutually opposite directions. Thus, when both of these holding portions 5 are integrally fastened to a bonding head driving mechanism via the transducer holder 30, the leaking energies are mutually cancelled in the transducer holder 30, and the transmission of vibration to the bonding head driving mechanism is prevented.

Furthermore, in the shown embodiment, the holding portions 5 and connecting portions 6 are disposed in a direction (horizontal direction) that crosses the direction of operation of the ultrasonic horn 1 (vertical direction). Accordingly, by utilizing the connecting portions 6 to fasten the ultrasonic horn 1 to the transducer holder 30 or to a bonding head driving mechanism, it is possible to increase the dimension in the direction of operation of the ultrasonic horn 1 and especially to increase the clearance on the underside of the ultrasonic horn 1 when the direction of operation is oriented downward. As a result, interference with the semiconductor device that constitutes the object of treatment or with device conveying rails, etc. can be avoided.

In the shown embodiment, the thin portions 14 are formed at the front and rear ends of the connecting portions 6. Accordingly, the transmission of the vibrational energy that leaks out from the holding portions 5 to the connecting portions 6 is buffered by the elastic deformation of the thin portions 14. In addition, since the thin portions 14 are formed as flat plates when viewed from above (see FIG. 1), the cross-sectional secondary moment of the thin portions 14 is extremely small, and the thin plate portions 14 easily undergo elastic deformation, thus being suitable for buffering the vibrational energy.

The ultrasonic horn 1 is manufactured with the holding portions 5 and connecting portions 6 provided therein by way of forming through-holes 20 in a round bar material used as a matrix material for the horn main body 4. Accordingly, working is facilitated in cases where cutting, casting, forging and other working are executed. In the present invention, two through-holes 20 are bored in the same direction (i.e., the vertical direction). Accordingly, such two through-holes 20 are formed in the same direction, and boring by cutting and mold release in the case of casting or forging is efficiently performed. Moreover, the working of the through-holes 20 is accomplished using a tool that is smaller than that used in the working of the flange 54 in the conventional horn. Accordingly, the ultrasonic horn 1 of the present invention is greatly reduced in size as a whole.

Furthermore, in the shown embodiment, the portions of the respective holding portions 5 that are connected by the connecting portions 6 are the tip ends of the respective protruded holding portions 5. In the present invention, however, the portions of the respective holding portions 5 that are connected by the connecting portions 6 are not limited to such tip ends of the protruded holding portions 5. The substantially same effect can be obtained as long as the portions that are connected are located at positions that differ from the areas where the respective holding portions are connected to (or protrude from) the horn main body. In addition, in the shown embodiment, the holding portions 5 are provided at two locations on each side with respect to the axial center 4b of the horn main body 4. However, the holding portions 5 can be provided in three or more locations on each side of the horn main body 4. The holding portions 5 and connecting portions 6 can be provided in an asymmetrical fashion in the left-right direction with respect to the horn main body 4.

The embodiment above is described with reference to a wire bonding apparatus. However, the present invention is not limited to a wire bonding apparatus. The present invention is applicable to various types of apparatuses that perform a processing action with a use of load and vibration of a transducer, such as a die bonding apparatus, a flip-chip bonding apparatuses, etc. All of these applications are within the scope of the present invention. Furthermore, the shape of the transducer is likewise not limited to one shown in the above embodiment, and various types of shapes can be selected in accordance with the use and purpose of the apparatus.

What is claimed is:

1. A transducer caused to vibrate by an operation of a vibrator, said transducer comprising:
    holding portions which are provided in at least two locations that include nodes of vibration in a transducer main body, and
    connecting portions that connect said holding portions to each other at areas that differ from areas where said holding portions protrude from said transducer main body, and wherein
        said transducer main body, said holding portions and said connecting portions are integrally formed from a single material member.

2. The transducer according to claim 1, wherein said holding portions are of a plate-form and are disposed in a direction of operation of said transducer main body.

3. The transducer according to claim 1, wherein
    of said holding portions, one holding portion is disposed at an n-th node (n is a natural number) position from a base end of said transducer main body, and another holding portion is disposed at an n+m-th node (m is an odd number) position, and
    said connecting portions are provided with fastening means for fastening said connecting portions to a transducer holder.

4. The transducer according to claim 3, wherein said fastening means are disposed at at least two different positions in a direction of length of said connecting portions.

5. The transducer according to claim 4, wherein said fastening means are respectively disposed in positions that are equal to each other in terms of length of vibration transmission paths that are formed by said holding portions and said connecting portions.

6. The transducer according to claim 1, wherein said holding portions and said connecting portions are disposed on both sides of an axial center of said transducer main body in a symmetrical fashion with respect to said axial center.

7. The transducer according to claim 1, wherein said holding portions and said connecting portions are provided in directions that cross a direction of operation of said transducer.

8. The transducer according to claim 1, further comprising thin portions that absorb said vibrations, said thin portions being disposed between said holding portions and said connecting portions.

9. The transducer according to claim 1, wherein through-holes are formed in a matrix material for said transducer main body, and said holding portions and said connecting portions are formed around said through-holes.

10. A bonding apparatus which includes said transducer according to any of claims 1 through 9.

11. A transducer in a form of a bonding horn used in a bonding apparatus and vibrated by a vibrator, said transducer comprising:

a transducer main body including a front-side portion provided at an end thereof with a capillary mounting hole and a rear-side portion provided therein with a vibrator;

at least two holding portions formed on either side of an axis center of said transducer main body, said at least two holding portions protruding at right angles with respect to a direction of length of said transducer main body and provided at locations that correspond to nodes of vibration of said transducer main body, and a connecting portion that connect tip ends of said at least two holding portions to each other; wherein said transducer has an empty space on either side of said transducer main body, said empty space being defined by said transducer main body, said at least two holding portions and said connecting portion.

12. The transducer according to claim 11, further comprising thin portions provided between said connecting portion and said tip ends of said holding portions.

13. The transducer according to claim 11, further comprising screw holes formed in said connecting portion, said screw holes being oriented at right angles with respect to said axis center of said transducer main body so that said transducer main body is mounted to a transducer holder.

* * * * *